March 26, 1968 — J. C. CLAYTON — 3,375,486

ELECTRICAL MALE CONNECTOR

Filed Dec. 7, 1965

INVENTOR
JOHN C. CLAYTON

BY Browne, Schuyler & Beveridge
ATTORNEYS

United States Patent Office 3,375,486
Patented Mar. 26, 1968

3,375,486

ELECTRICAL MALE CONNECTOR

John C. Clayton, Morristown, N.J., assignor to Aircraft Radio Corporation, Boonton, N.J., a corporation of New Jersey Filed Dec. 7, 1965, Ser. No. 512,070
3 Claims. (Cl. 339—252)

ABSTRACT OF THE DISCLOSURE

This invention relates to a male electrical connector for use in conjunction with printed circuit boards. The connector is fabricated of a single piece of resilient electrically conductive metal. Use of a non-conductive center pin provides structural rigidity and allows easy insertion and withdrawal of the connector from a circuit board.

This invention relates to male connectors for printed electrical circuit boards.

Present electronic technology makes extensive use of printed circuitry in which an electrical circuit is attached to the surfaces of a thin non-conductive board. All circuit wiring is bonded to the under side of the board. Connections between circuit components and circuit wiring are made by inserting component leads through holes in the circuit board and soldering the leads to the wiring beneath.

Entire circuit blocks or modules, such as amplifiers, may be placed on a single board. Interconnections between boards or with input-output circuits are usually made with male and female connectors so that the board connections may be easily removed.

Male connectors or "banana plugs" which connect to wiring on the under side of printed circuit boards are well known. This invention relates to an improved connector which will operate as satisfactorily as older connectors, but be substantially cheaper to manufacture and easier to use.

Existing banana plug designs consist of a brass pin to which a spring element is riveted. The spring element serves as the electrical contact. The rivet joint, required for mechanical strength, is subsequently soldered to provide adequate electrical continuity.

According to this invention, a single, cross-shaped spring is bent to form a four-sided elongated connector. One opposite pair of the connector sides has side extensions which serve as stops to support the connector against the upper side of a printed wiring board. The opposite pair of sides have diverging lower tips which hold the connector against the underside of the circuit board after insertion. After the connector is inserted in a board, a pin, preferably of nylon or some similar material, is inserted into the plug from beneath the board. The pin serves to make the attachment of the connector to the board strong enough to withstand rough handling prior to soldering and to provide mechanical strength after soldering. Each of the four sides is bent outwardly to form the usual resilient electrical contact portion.

A significant advantage of the connector according to this invention is the ease with which it may be removed and replaced without destroying the circuit board on which it is mounted.

With conventional banana plugs, it is necessary to drill out the riveted base with the attendant possibility of destroying an expensive circuit. Further, this invention eliminates the solder joint between the central pin and side springs of conventional banana plugs, insuring more reliable electrical continuity.

Objects and uses of this invention may be readily appreciated from the following detailed description and the appended drawings, wherein.

Figure 1:
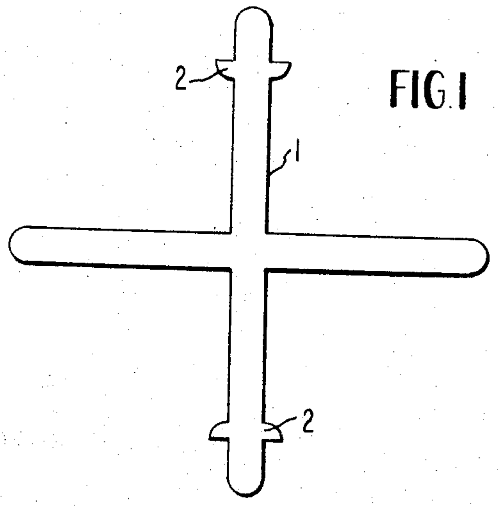
FIGURE 1 illustrates the connector prior to final forming.

Referring to FIGURE 1, the connector is shown prior to being formed into its final shape. It consists of a cross-shaped spring 1 having four arms of approximately equal length. One pair of opposite sides is provided with laterally projecting stops 2 located near the outer ends of the arms. Stops 2 provide a shoulder for supporting the connector against the upper side of a circuit board prior to soldering. The cross-shaped spring may be readily stamped from any suitable resilient material.

Figure 2:
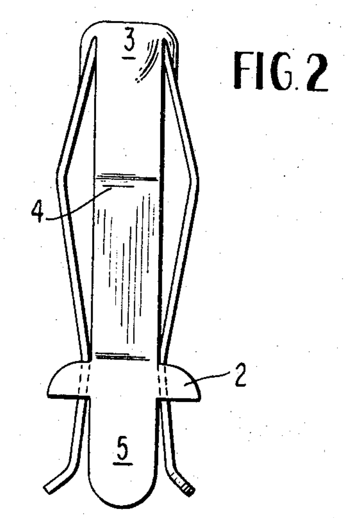
FIGURE 2 is a side view of the connector according to this invention.
Figure 3:
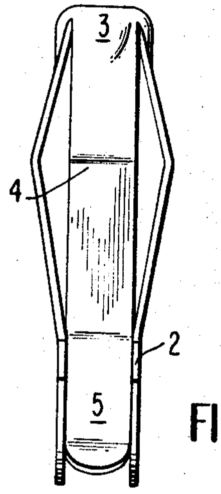
FIGURE 3 is a view taken at a right angle to that of FIGURE 2.
Figure 4:
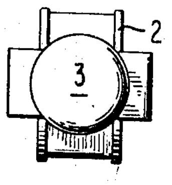
FIGURE 4 is a top view of the connector.

FIGURES 2 and 3 show the spring after it has been formed into the male connector of this invention. Each of the four sides is connected at the upper end of nose portion 3. To facilitate easy insertion, nose portion 3 is circular in cross-section, as shown in FIGURE 4.

Contact portion 4 of the connector is formed by diverging each of the four sides away from nose portion 3 for approximately half of the length of contact portion 4 and then converging them toward the lower end of the connector or soldering portion 5.

Figure 5:
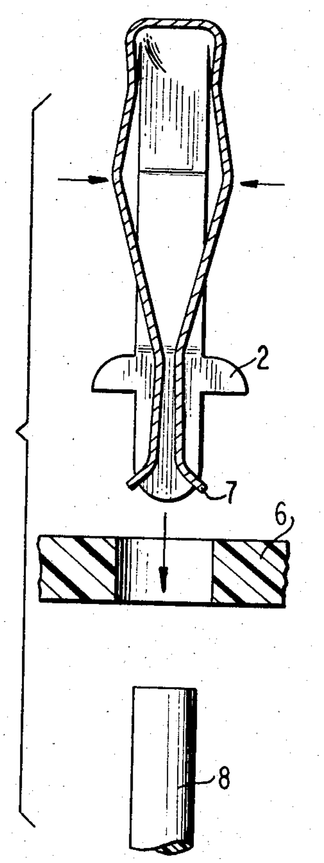
FIGURE 5 illustrates the manner of inserting the connector in a circuit board.

FIGURE 5 illustrates the manner of inserting the connector into a circuit board 6. The spring sides with diverging lower tips 7 are pressed inwardly as indicated by the arrows so that the tips may be inserted into circuit board 6. After the connector is inserted, shoulders 2 support the connector against the upper side of circuit board 6. When the connector is released, tips 7 grip the underside of the circuit board. In order to provide structural rigidity both before and after soldering, and to prevent harmful capillary flow of solder, pin 8 is inserted into the connector from beneath circuit board 6. The length of pin 8 is chosen so that it will reach from nose portion 3 to within the hole in circuit board 6. Further, the diameter of pin 8 is made slightly less than the interior diameter of nose portion 3 so that the connector will be tightly held. Unless pin 8 is removed, tips 7 prevent the connector from being pulled out of the board.

Figure 6:
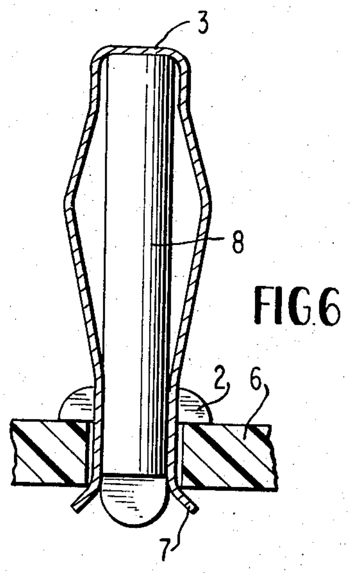
FIGURE 6 illustrates in cross-section a connector in place in a circuit board after the pin has been inserted.

After the connector and pin is assembled as shown in FIGURE 6, the lower end of the connector is soldered to printed wiring on the underside of circuit board 6.

To remove the connector, it is only necessary that the solder holding the connector be removed and either pin 8 be pulled or diverging tips 7 be bent inwardly. Thereafter, the connector may be easily lifted from the circuit board without damaging the circuit wiring.

As will be appreciated by those skilled in the art, changes in the design of the male connector may be made without departing from the spirit of this invention. It is intended that this invention be limited only by the appended claims.

What is claimed is:

1. A male connector for electrical circuit boards, comprising an elongated four-sided resilient connector having nose and soldering portions and an intermediate contact portion, the four sides being connected at the nose portion, first and second pairs of opposite sides, each pair diverging from said nose portion to a position in said contact portion and converging from said position to said soldering portion to provide resiliency in a direction transverse the elongated axis of the connector, said first pair diverging at said soldering portion, and stop means extending outwardly from sides of said second pair between said contact and said soldering portions for supporting the connector against one side of a circuit board.

2. The male connector of claim 1, further comprising pin means within said connector extending from said nose portion to said soldering portion for providing structural rigidity.

3. The male connector of claim 2 wherein said nose portion is circular in cross-section and said pin means is approximately of the same diameter as the interior diameter of said nose portion.

References Cited

UNITED STATES PATENTS

| | | | |
|---|---|---|---|
| 1,671,540 | 5/1928 | Monteil | 339—272 |
| 2,517,677 | 8/1950 | Kjell-Berger et al. | 339—252 |
| 2,877,441 | 3/1959 | Narozny | 339—217 |
| 2,950,458 | 8/1960 | Artz | 339—217 |
| 3,059,213 | 10/1962 | Lalonde | 339—217 |
| 3,178,673 | 4/1965 | Krehbiel | 339—217 |
| 3,252,127 | 5/1966 | Woodward | 339—252 |

MARVIN A. CHAMPION, *Primary Examiner.*

R. STROBEL, *Assistant Examiner.*